United States Patent [19]
Matsuura et al.

[11] Patent Number: 5,565,415
[45] Date of Patent: Oct. 15, 1996

[54] METHOD FOR MANUFACTURING TUNNEL JUNCTION TYPE JOSEPHSON DEVICE COMPOSED OF COMPOUND OXIDE SUPERCONDUCTOR MATERIAL

[75] Inventors: Takashi Matsuura; Saburo Tanaka; Hideo Itozaki, all of Itami, Japan

[73] Assignee: Sumitomo Electric Industries, Ltd., Osaka, Japan

[21] Appl. No.: 487,543

[22] Filed: Jun. 7, 1995

Related U.S. Application Data

[63] Continuation of Ser. No. 284,278, Aug. 2, 1994, abandoned, which is a continuation of Ser. No. 145,302, Nov. 3, 1993, abandoned, which is a continuation of Ser. No. 819,291, Jan. 10, 1992, abandoned.

[30] Foreign Application Priority Data

Jan. 10, 1991 [JP] Japan ................... 3-018222

[51] Int. Cl.$^6$ ................................ H01L 39/24
[52] U.S. Cl. .............. 505/329; 505/473; 505/475; 505/190; 505/702; 427/62; 427/419.3; 204/192.24
[58] Field of Search ................. 505/329, 190, 505/473, 475, 702, 731; 427/62, 63, 419.2, 419.3, 126.3; 204/192.24

[56] References Cited

U.S. PATENT DOCUMENTS 5,061,687 10/1991 Takada et al. ................ 505/1

FOREIGN PATENT DOCUMENTS

| | | |
|---|---|---|
| 0371481 | 11/1989 | European Pat. Off. . |
| 0341148A2 | 11/1989 | European Pat. Off. . |
| 0459906 | 5/1991 | European Pat. Off. . |
| 3-285373 | 12/1991 | Japan . |

OTHER PUBLICATIONS

Brice, "Crystal Growth Process", Chapt. 11, John Wiley and Sons, New York, (1986) pp. 246–255.

S. Tanaka et al, IEEE Transactions On Magnetics, vol. 27, No. 2, Mar. 1991, pp. 1607–1611, New York, US.

Hirata et al, "Tunneling measurements on superconductor/insulator/superconductor junctions using single–crystal $YBa_2Cu_3O_{7-x}$ thin films" Appl. Phys. lett. 56(7) Feb. 1990 pp. 683–685.

Furuyama et al, "In–situ growth of $YBa_2Cu_3O_{7-x}$ thin films by reactive co–evaporation technique," 2nd Workshop on High–Temperature Superconducting Electron Devices, Jun. 1989 (Japan) pp. 105–108.

*Primary Examiner*—Roy V. King
*Attorney, Agent, or Firm*—Foley & Lardner

[57] ABSTRACT

For manufacturing a superconducting device having a tunnel junction formed of an extremely thin insulator layer sandwiched between a pair of oxide superconductor thin films, a first superconducting layer of oxide superconductor thin film is formed on a substrate, and a MgO thin film is deposited on the first superconducting layer at a substrate temperature of not higher than 200° C. The MgO thin film is heat-treated so that crystallinity of the deposited MgO thin film is improved, and thereafter, a second superconducting layer of oxide superconductor thin film is formed on the MgO thin film.

21 Claims, 1 Drawing Sheet

METHOD FOR MANUFACTURING TUNNEL JUNCTION TYPE JOSEPHSON DEVICE COMPOSED OF COMPOUND OXIDE SUPERCONDUCTOR MATERIAL

This application is a continuation of application Ser. No. 08/284,278, filed Aug. 2, 1994; which is a continuation of application Ser. No. 08/145,302, filed Nov. 3, 1993; which is a continuation of application Ser. No. 07/819,291, filed Jan. 10, 1992, all abandoned.

BACKGROUND OF THE INVENTION

1. Field of the Invention

The present invention relates to a method for manufacturing a superconducting device, and more specifically to a novel method for manufacturing a superconducting device including a tunnel junction composed of a pair of superconducting electrode layers composed of oxide superconductor materials, and an insulating layer sandwiched between the pair of superconducting electrode layers

2. Description of Related Art

Superconducting materials known in the prior art had become a superconductor only at an extremely low temperature not higher than a liquid helium temperature, and therefore, it had not been considered to practically utilize the superconducting material. However, since it was reported in 1986 that compound oxide sintered material such as $(La, Ba)_2CuO_4$ or $(La, Sr)_2CuO_4$ are a superconductor material having a high critical temperature (Tc), it has been confirmed from one to another that a compound oxide such as a Y—Ba—Cu—O type compound oxide or a Bi—Ca—Sr—Cu—O type compound oxide shows a superconducting characteristics at an extremely high temperature. These materials showing the superconducting characteristics at the high temperature permit to use an inexpensive liquid nitrogen for a cooling medium, and therefore, application of superconductor technique has abruptly been put under study as an actual matter.

A Josephson device is one of elementary electronic devices utilizing the superconducting phenomenon. The Josephson device is constituted of a weak link or junction between a pair of superconducting electrodes, and has various unique characteristics, for example, a DC Josephson effect which is said to be due to a tunnel effect of cooper pairs, an AC Josephson effect showing a discrete voltage/current characteristics, etc.

On the other hand, the oxide superconducting materials were obtained in the form of a sintered body produced by a powder metallurgy process at the beginning of research and development, but the sintered oxide superconducting materials could not have a good result, particularly in a critical current density. Lastly, a method for manufacturing the oxide superconducting materials in the form of a thin film are widely studied. One typical example of the Josephson devices formed of the oxide superconducting thin films is a tunnel type Josephson device including the superconducting tunnel junction.

The most typical construction of a tunnel junction type Josephson device includes a first superconducting layer formed of an oxide superconductor thin film on a substrate, an insulator layer formed on the first superconducting layer, and a second superconducting layer formed of an oxide superconductor thin film on the insulator layer. Here, the insulator layer is extremely thin, and actually is formed of an insulator thin film having a thickness of not more than 20 Å.

In the above mentioned tunnel junction type Josephson device, formation of the insulator layer requires a greatly high level of technique. Namely, the insulator layer is required to have the thickness of not more than 20 Å as mentioned above, but it is very difficult to form this extremely thin insulator film without pinholes, on an oxide superconductor material layer. If this extremely thin insulator layer has pinholes, the first and second superconducting layers short-circuit to each other, so that the device no longer exerts its function. For this reason, it has been said to be difficult to actually form a tunnel type junction.

SUMMARY OF THE INVENTION

Accordingly, it is an object of the present invention to overcome the above mentioned defect of the conventional one.

Another object of the present invention is to provide a method for manufacturing a superconducting device having an extremely thin insulator film, by using conventional processes, and with good reproducibility.

The above and other objects of the present invention are achieved in accordance with the present invention by a method for manufacturing a superconducting device having a tunnel junction formed of an extremely thin insulator layer sandwiched between a pair of oxide superconductor thin films, the method including the steps of forming a first superconducting layer of oxide superconductor thin film on a substrate, depositing on the first superconducting layer an oxide insulator layer having no pinhole, heat-treating the deposited oxide insulator layer so as to improve crystallinity of the deposited oxide insulator layer, and forming a second superconducting layer of oxide superconductor thin film on the oxide insulator layer.

As seen from the above, the method of the present invention is characterized in a unique process of formation of the oxide insulator thin film as the tunnel barrier insulating layer. This unique process of formation of the oxide insulator thin film makes it possible to manufacture the superconducting device including the insulator layer which is sandwiched between a pair of oxide superconductor thin films and which is extremely thin in thickness and stable and excellent in insulation characteristics.

As mentioned above, the unique process of formation of the oxide insulator thin film in accordance with the present invention includes a first step of depositing an oxide insulator thin film having no pinhole even though the deposited oxide insulator thin film is not so good in crystallinity, and a second step of heat-treating the deposited oxide insulator thin film so as to improve crystallinity of the oxide insulator layer.

Generally speaking, the insulator thin film having no pinhole can be formed by depositing the oxide insulator material at a low substrate temperature. Therefore, the oxide insulator thin film deposited on the first superconducting layer in the first step involves various defects. However, since the heat-treatment preformed in the second step improves crystallinity of the deposited oxide insulator thin film, the heat-treated oxide insulator thin film has an excellent crystallinity without pinhole.

The substrate temperature when the oxide insulator thin film is deposited can be freely determined if the deposited oxide insulator thin film forms no island, namely, has no pinhole.

On the other hand, the temperature and time length of the heat treatment can be freely determined in the extent ensuring that the crystallinity of the oxide insulator thin film is improved without being polycrystallized so as to form no island and without giving an adverse effect to the oxide superconductor thin films. In this connection, it is preferred to carry out the heat treatment in oxygen atmosphere.

In the above mentioned tunnel junction superconducting device, each of the first and second superconducting layers can be formed of general oxide superconducting materials such as a high critical temperature (high-Tc) copper-oxide type oxide superconductor material typified by a Y—Ba—Cu—O type compound oxide superconductor material, a Bi—Sr—Ca—Cu—O type compound oxide superconductor material, and a Tl—Ba—Ca—Cu—O type compound oxide superconductor material. In addition, each of the first and second superconducting layers of oxide superconductor material can be formed by a physical deposition or a chemical deposition, both of which are well known to persons skilled in the art. In particular, a sputtering can be advantageously utilized.

The oxide insulator thin film can be formed of a material selected from the group consisting of $MgO$, $SrTiO_3$, $NdGaO_3$, $Y_2O_3$, $LaAlO_3$, $LaGaO_3$, $Al_2O_3$, and $ZrO_2$. However, the material for the oxide insulator thin film is not limited to these materials, and the oxide insulator thin film can be formed of any oxide material which does not diffuse into the high-Tc copper-oxide type oxide superconductor material used, and which substantially matches in crystal lattice with the high-Tc copper-oxide type oxide superconductor material used, so that a clear boundary is formed between the oxide insulator thin film and the superconducting layer of the high-Tc copper-oxide type oxide superconductor material. From this viewpoint, it can be said to be possible to use an oxide insulating material conventionally used for forming a substrate on which a high-Tc copper-oxide type oxide superconductor material is deposited.

A preferred substrate on which the above mentioned tunnel junction superconducting device is formed, includes a $MgO$ single crystal, a $SrTiO_3$ single crystal, a $NdGaO_3$ single crystal substrate, a $Y_2O_3$, single crystal substrate, a $LaAlO_3$ single crystal, a $LaGaO_3$ single crystal, a $Al_2O_3$ single crystal, and a $ZrO_2$ single crystal.

For example, the oxide superconductor thin film can be deposited by using, for example, a (100) surface of a $MgO$ single crystal substrate, a (110) surface or (100) surface of a $SrTiO_3$ single crystal substrate and a (001) surface of a $NdGaO_3$ single crystal substrate, as a deposition surface on which the oxide superconductor thin film is deposited.

In one preferred embodiment, the method in accordance with the present invention for manufacturing a superconducting device having a tunnel junction formed of an extremely thin insulator layer sandwiched between a pair of oxide superconductor thin films, includes the steps of forming a first superconducting layer of oxide superconductor thin film on a substrate, depositing a MgO thin film on the first superconducting layer at a substrate temperature of not higher than 200° C., heat-treating the MgO thin film, and forming a second superconducting layer of oxide superconductor thin film on the MgO thin film.

As mentioned above, the unique process of formation of the MgO thin film includes a first step of depositing a MgO thin film at a substrate temperature of not higher than 200° C., and a second step of heat-treating the deposited MgO thin film.

The MgO thin film deposited on the first superconducting layer in the first step involves various defects. However, the heat-treatment preformed in the second step improves crystallinity of the MgO thin film so that the MgO thin film has no pinhole and therefore has an excellent quality.

In the first step, if the substrate temperature is higher than 200° C., the deposited MgO thin film as extremely thin as 20 Å is grown in the form of islands, and therefore, pinholes inevitably occur. On the other hand, if the MgO thin film is deposited at a temperature of not higher than 200° C., the deposited MgO thin film can be grown without pinholes.

In addition, the heat treatment in the second step is preferably conducted in the range of 300° C. to 700° C. inclusive for a period of time not shorter than 10 minutes but not longer than 2 hours. If the heat treatment temperature in the second step is lower than 300° C., or if heat treatment time is shorter than 10 minutes, the improvement in crystallinity of the MgO thin film cannot be sufficiently promoted. On the other hand, if the heat treatment temperature in the second step is higher than 700° C., the "as-deposited" MgO thin film is rather polycrystallized, and therefore, the quality of the deposited MgO thin film is rather deteriorated. On the other hand, even if the heat treatment time is longer than 2 hours, a substantial difference cannot be found in the improvement in crystallinity of the MgO thin film.

The above and other objects, features and advantages of the present invention will be apparent from the following description of a preferred embodiment of the invention with reference to the accompanying drawings. However, it should be noted that the following disclosure is merely one embodiment for making it easier to understand the present invention, and the present invention is in no way limited to the details of the illustrated structures.

DESCRIPTION OF THE PREFERRED EMBODIMENTS

Figure 1A:
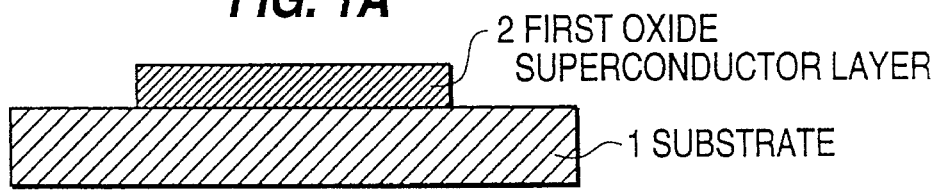
FIGS. 1A, 1B, 1C and 1D are diagrammatic sectional views illustrating various steps of an embodiment of the method in accordance with the present invention for manufacturing a tunnel junction superconducting device.

First, as shown in FIG. 1A, an oxide superconductor material thin film forming a first superconducting layer 2 is formed on a substrate 1 by any deposition process well known to persons skilled in the art.

Figure 1B:
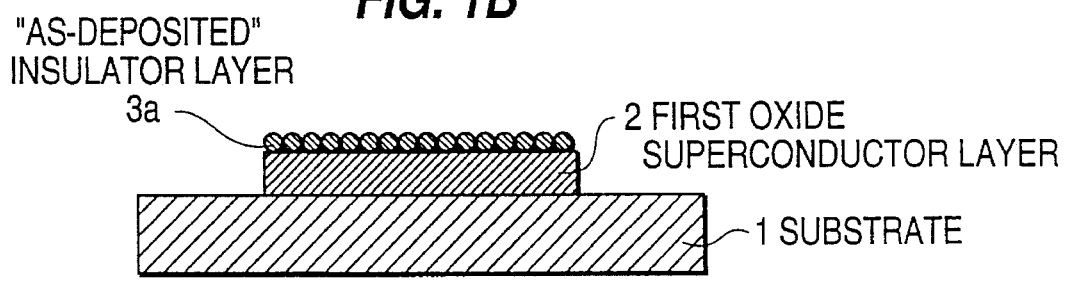

Then, as shown in FIG. 1B, an oxide insulator layer 3a is deposited on the first superconducting layer 2 at a low temperature. The "as-deposited" oxide insulator layer 3a grown at the low temperature includes many defects.

Figure 1C:
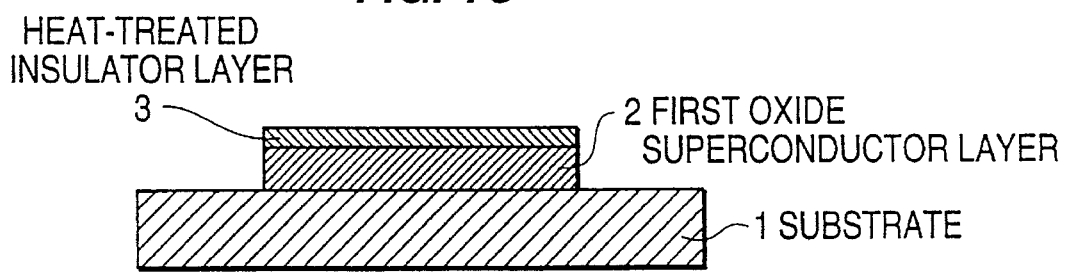

Succeedingly, as shown in FIG. 1C, a heat treatment is conducted to improve crystallinity of the oxide insulator layer 3a so as to convert it into a crystallinity-improved oxide insulator thin film 3.

Figure 1D:
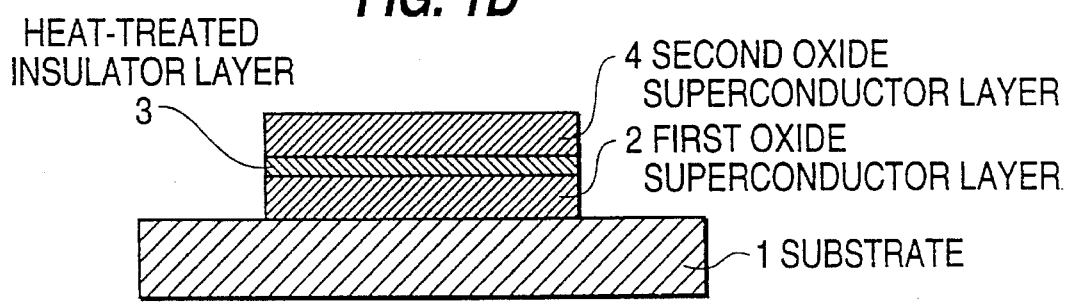

Finally, as shown in FIG. 1D, an oxide superconductor material thin film forming a second superconducting layer 4 is formed on the thin film 3 by any deposition process well known to persons skilled in the art.

Thus, a superconducting device including a tunnel junction having as a barrier layer an insulator layer of a good quality is completed.

A superconducting device including a tunnel junction was manufactured in the process described above with reference to FIGS. 1A to 1D.

On a MgO substrate of 20 mm×20 mm square, a Y—Ba—Cu—O type oxide superconductor thin film was deposited by a sputtering.

A deposition condition for the sputtering is as follows:

| | |
|---|---|
| Target | Mixture of oxides of Y, Ba and Cu Y:Ba:Cu = 1.0:2.0:3.7 in atomic ratio |
| Substrate temperature | 620° C. |
| Sputtering gas | Mixed gas of Ar and $O_2$ ($O_2$/Ar + $O_2$) = 0.2 (volume ratio) |
| Sputtering pressure | 20 mTorr |
| Deposition speed | 1000 Å/hour |
| Film thickness | 2000 Å |

Then, a MgO thin film forming the insulator layer is deposited on the oxide superconductor thin film by a sputtering.

A sputtering condition for the MgO thin film is as follows:

| | |
|---|---|
| Target | MgO single crystal |
| Substrate temperature | 200° C. |
| Sputtering gas | Mixed gas of Ar and $O_2$ ($O_2$/Ar + $O_2$) = 0.2 (volume ratio) |
| Sputtering pressure | 20 mTorr |
| Deposition speed | 1 Å/minute |
| Film thickness | 10 Å |

The MgO thin film deposited as mentioned above was amorphous. Thereafter, the deposited MgO thin film was heat-treated under the following condition:

Treatment temperature: 600° C.

Treatment time: 0.5 hour

Atmosphere: $O_2$ gas

The MgO thin film heat-treated as mentioned above was crystallized. Furthermore, an oxide superconductor thin film forming the second superconducting layer was deposited under the same condition as that for the oxide superconductor thin film forming the first superconducting layer.

The characteristics of the superconducting device thus formed having the tunnel junction was measured by providing contacts to the the superconducting device, and by cooling the superconducting device to a temperature of not higher than 90K and applying a microwave of 11 GHz in frequency and 0.1 W in power. As a result, Shapiro steps were observed at voltages correspondings to multiples of 22.7 μV. It can be concluded from this observation that an effective tunnel junction is formed.

For comparison, a MgO thin film was deposited at 220° C. The deposited MgO film was grown in the form of islands, and pinholes occur in the deposited MgO film. These pinholes did not disappear even after the heat-treatment was conducted. As a result, since it can generally be said that it is preferred to deposit an oxide insulator material at a low substrate temperature in order to form a pinholeless oxide insulator thin film, it can be said that if MgO is deposited at a substrate temperature which is at least not higher than 200° C., a pinholeless MgO thin film can be deposited.

In the case of heat-treating the MgO thin film at a temperature of lower than 300° C., crystallinity of the deposited MgO thin film was not improved. On the other hand, in the case of of heat-treating the MgO thin film at a temperature of higher than 700° C., the deposited MgO thin film was rather polycrystallized. In both cases, the Y—Ba—Cu—O layer deposited on the MgO layer is deteriorated in crystallinity, and the resultant superconducting device did not show a Shapiro step.

As seen from the above, the method in accordance with the present invention for manufacturing the superconducting device makes it possible to form an extremely thin, excellent crystalline, pinholeless, insulator layer, with good reproducibility. Accordingly, it becomes possible to manufacture a tunnel junction type Josephson device which is the most elementary device in the superconductor technology.

The invention has thus been shown and described with reference to the specific embodiments. However, it should be noted that the present invention is in no way limited to the details of the illustrated structures but changes and modifications may be made within the scope of the appended claims.

We claim:

1. A method for manufacturing a superconducting device having a tunnel junction formed of an extremely thin insulator layer having a thickness sufficient to form a tunnel junction barrier, said insulator layer being sandwiched between a pair of oxide superconducting layers, the method including forming a first oxide superconducting layer on a substrate, depositing at a temperature not higher than 200° C. on the first superconducting layer an amorphous oxide insulator layer having no pinhole, heat-treating the deposited oxide insulator layer so as to improve crystallinity of the deposited oxide insulator layer at a temperature not lower than 300° C. and not higher than 700°, and forming a second oxide superconducting layer on the oxide insulator layer.

2. A method claimed in claim 1 wherein the first and second oxide superconducting layer are formed of a high-Tc copper-oxide oxide superconductor material.

3. A method claimed in claim 2 wherein the oxide insulator thin film is formed of a material selected from the group consisting of MgO, $SrTiO_3$, $NdGaO_3$, $Y_2O_3$, $LaAlO_3$, $LaGaO_3$, $Al_2O_3$, and $ZrO_2$.

4. A method claimed in claim 3 wherein the oxide insulator thin film is deposited on the first superconducting layer so as to have a thickness of not more than 20 Å.

5. A method claimed in claim 3 wherein the first and second oxide superconducting layers are independently formed of a material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

6. A method claimed in claim 3 wherein the substrate is formed of a material selected from the group consisting of a MgO single crystal, a $SrTiO_3$ single crystal, a $NdGaO_3$ single crystal, a $Y_2O_3$ single crystal, a $LaAlO_3$ single crystal, a $LaGaO_3$ single crystal, a $Al_2O_3$ single crystal, and a $ZrO_2$ single crystal.

7. A method claimed in claim 3 wherein the substrate is formed of a material selected from the group consisting of a MgO (100) substrate, a $SrTiO_3$ (110) substrate, a $SrTiO_3$ (100) substrate and a $NdGaO_3$ (001) substrate.

8. A method claimed in claim 2 wherein the oxide insulator layer is formed of MgO.

9. A method claimed in claim 8 wherein the MgO thin film is deposited on the first superconducting layer so as to have a thickness of not more than 20 Å.

10. A method claimed in claim 8 wherein the MgO thin film is heat-treated at a temperature not lower than 300° C. but not higher than 700° C. for a period of time not shorter than 10 minutes but not longer than 2 hours.

11. A method claimed in claim 10 wherein the MgO thin film is deposited by a sputtering using a MgO single crystal as a target.

12. A method claimed in claim 10 wherein the first and second oxide superconducting layers are independently formed of a material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

13. A method claimed in claim 10 wherein the substrate is formed of a material selected from the group consisting of a MgO single crystal, a $SrTiO_3$ single crystal, a $NdGaO_3$ single crystal, a $Y_2O_3$ single crystal, a $LaAlO_3$ single crystal, a $LaGaO_3$ single crystal, a $Al_2O_3$ single crystal, and a $ZrO_2$ single crystal.

14. A method claimed in claim 10 wherein the substrate is formed of a material selected from the group consisting of a MgO (100) substrate, a $SrTiO_3$ (110) substrate, a $SrTiO_3$ (100) substrate, a $SrTiO_3$ (100) substrate and a $NdGaO_3$ (001) substrate.

15. A method for manufacturing a superconducting device having a tunnel junction formed of an extremely thin insulator layer having a thickness sufficient to form a tunnel junction barrier, said insulator layer being sandwiched between a pair of oxide superconducting layers, the method including forming a first oxide superconducting layer on a substrate, depositing by a sputtering, an amorphous MgO thin film on the first superconducting layer at a substrate temperature of not higher than 200 °C., heat-treating the MgO thin film at a temperature not lower than 300° C. and not higher than 700°, and forming a second oxide superconducting layer on the oxide insulator layer.

16. A method claimed in claim 15 wherein the MgO thin film is deposited by a sputtering using a MgO single crystal as a target, so that the deposited MgO thin film has a thickness of not more than 20 Å.

17. A method claimed in claim 16 wherein the MgO thin film is heat-treated in an oxygen atmosphere at a temperature not lower than 300° C. but not higher than 700° C. for a period of time not shorter than 10 minutes but not longer than 2 hours.

18. A method claimed in claim 17 wherein the first and second oxide superconducting layers are formed of a high-Tc copper-oxide oxide superconductor material and wherein the substrate is formed of a material selected from the group consisting of a MgO single crystal, a $SrTiO_3$ single crystal, a $NdGaO_3$ single crystal, a $Y_2O_3$ single crystal, a $LaAlO_3$ single crystal, a $LaGaO_3$ single crystal, a $Al_2O_3$ single crystal, and a $ZrO_2$ single crystal.

19. A method claimed in claim 17 wherein the first and second superconducting oxide layers are independently formed of a material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material, and wherein the substrate is formed of a material selected from the group consisting of a MgO (100) substrate, a $SrTiO_3$ (110) substrate, a $SrTiO_3$ (100) substrate and a $NdGaO_3$ (001) substrate.

20. A method for manufacturing a tunnel junction Josephson device with a tunnel junction formed of an ultrathin insulator layer having a thickness sufficient to form a tunnel junction barrier, said insulator layer being sandwiched between a pair of superconducting layers, the method including:

forming a first oxide superconducting layer on a substrate;

depositing on the first superconducting layer a pinholefree amorphous MgO oxide insulator layer at a temperature not higher than 200° C.;

heat-treating the deposited oxide insulator layer to improve crystallinity of the deposited oxide insulator layer at a temperature not lower than 300° C. and not higher than 700°; and forming a second oxide superconducting layer on the oxide insulator layer.

21. A method for manufacturing a superconducting device having a tunnel junction formed of an extremely thin insulator layer having a thickness sufficient to form a tunnel junction barrier, the insulator layer being sandwiched between a pair of oxide superconducting layers, the method including:

forming a first superconducting layer of oxide superconductor on a substrate, depositing on the first superconducting layer a pinholefree amorphous oxide insulator layer, the oxide insulator layer being deposited at a substrate temperature of not higher than 200° C., heat-treating the depositing oxide insulator layer for at least ten minutes at a temperature between 300° and 700° C. so as to improve crystallinity of the deposited oxide insulator layer without causing the deposited oxide insulator layer to become polycrystallized, and forming a second oxide superconducting layer on the oxide insulator layer, the oxide insulator layer being formed of a material which matches the first and second superconducting layers in crystal lattice so that a clear boundary is formed between the oxide insulator layer and each of the superconducting layers.

* * * * *